United States Patent [19]
Gourgue et al.

[11] Patent Number: 5,742,612
[45] Date of Patent: Apr. 21, 1998

[54] METHOD AND DEVICE FOR INTERLEAVING A SEQUENCE OF DATA ELEMENTS

[75] Inventors: Frédéric Gourgue; Fabrice de Seze, both of Paris, France

[73] Assignee: Alcatel Radiotelephone, Paris, France

[21] Appl. No.: 252,313

[22] Filed: Jun. 1, 1994

[30] Foreign Application Priority Data

Jun. 2, 1993 [FR] France ................................ 93 06574

[51] Int. Cl.$^6$ .................................................. G06F 11/00
[52] U.S. Cl. .................................................. 371/2.1
[58] Field of Search ............................ 371/2.1, 38.1, 371/39.1, 37.1

[56] References Cited

U.S. PATENT DOCUMENTS 4,545,052  10/1985  Steierman ........................ 370/68
5,430,767   7/1995  Min ............................... 375/340
5,465,260  11/1995  Zook .............................. 371/37.7

*Primary Examiner*—Phung M. Chung
*Attorney, Agent, or Firm*—Sughrue, Mion, Zinn, Macpeak & Seas, PLLC

[57] ABSTRACT

A source sequence including N data elements is interleaved to deliver an interleaved sequence according to a method which includes at least one interleaving step associating a data element of index j in the interleaved sequence with a data element of index i in the source sequence, where:

$$j = (a \cdot i + b) \ (\text{modulo } N) + 1, \ 1 \leq i \leq N \text{ and } 1 \leq j \leq N;$$

a is a predetermined integer relatively prime with N and such that $2 \leq a \leq N-1$; and
b is a predetermined integer such that $0 \leq b \leq N-1$.

13 Claims, 2 Drawing Sheets

| Index $i$ of SOURCE sequence elements | Index $j$ of INTERLEAVED sequence elements |
|---|---|
| 1 | 5 |
| 2 | 9 |
| 3 | 13 |
| 4 | 17 |
| 5 | 4 |
| 6 | 8 |
| 7 | 12 |
| 8 | 16 |
| 9 | 3 |
| 10 | 7 |
| 11 | 11 |
| 12 | 15 |
| 13 | 2 |
| 14 | 6 |
| 15 | 10 |
| 16 | 14 |
| 17 | 1 |

Example: $\begin{cases} N = 17 \\ a = 4 \\ b = 0 \end{cases}$

Example: $\begin{cases} N = 17 \\ a = 4 \\ b = 0 \end{cases}$

METHOD AND DEVICE FOR INTERLEAVING A SEQUENCE OF DATA ELEMENTS

BACKGROUND OF THE INVENTION

The invention concerns the interleaving of data elements of source digital signals. Interleaving techniques have many applications in digital signal processing, in particular in connection with the encryption and/or transmission of such signals.

In digital transmission (or broadcasting) interleaving eliminates or at least reduces problems due to various forms of interference with the transmission medium, including rapid fading and impulsive interference.

Data signals are encoded using error correcting codes such as convolutive codes enabling reconstruction of the source signal at the receiving end, even if some data elements are received in an erroneous form. However, this correction is possible only if there is a restricted number r of erroneous data elements in p consecutive data elements (the values of p and r depend on the code employed). It is not uncommon for fading to last for a period corresponding to transmission of several consecutive data elements.

Interleaving can alleviate this problem by changing the order of the data elements so that two data elements of the source signal less than p elements apart are sufficiently far apart in the signal transmitted (i.e. the interleaved signal) so that it is not possible for both to be affected by the same fade.

The efficacy of an interleaving device is indicated by its ability to split up a large block of errors. This can be formally stated as follows, where q is the length (number of bits) of error blocks to be split up and p is the number of consecutive bits over which it is desirable for there to be no accumulation of errors: the interleaving device is appropriate if two bits chosen from the q consecutive bits after interleaving are least p bits apart before interleaving.

At present there are two main interleaving techniques: matrix interleaving and convolutive interleaving.

In the matrix interleaving technique the data elements of a source sequence are written into a matrix row by row and read out of the matrix column by column to form an interleaved sequence.

For problem-free decoding the number of rows of the matrix must be greater than or equal to the maximal number (q) of data elements in a fade (more precisely, in a fade with the maximum duration which the transmission system can tolerate) and the number of columns of the matrix must be greater than or equal to the number p of consecutive data elements in which there must not be more than one erroneous data element.

This therefore requires that the length of each interleaved sequence be L=xy consecutive data elements. It is not always possible to conform to this constraint, especially if the length N of each sequence is imposed by the transmission system. This is the case when N is prime, or more generally if there are no two integers x and y satisfying the above conditions and factors of N. For example, N can be the number of data elements in a protocol unit (frame, packet, etc) managed by the system.

Another drawback of the matrix technique is that the first and last data elements to be written are not moved. Consequently, on processing two sequences of L data elements the first element of the second sequence will continue to follow on directly from the last element of the first sequence, even after interleaving. If fading occurs during transmission of these elements, decoding may not be possible.

Convolutive interleaving is suitable for transmitting bits in series in that the interleaving device (and the deinterleaving device) take and deliver the bits one by one, unlike the previous technique in which the bits are accumulated before they are interleaved (or deintereaved) and then output as a block. This type of interleaving introduces stuffing bits which reduces the capacity of the system, especially if the messages transmitted are short.

A major drawback of the convolutive interleaving technique is that it inserts stuffing elements into the wanted data elements. This reduces the efficacy of the transmission system in terms of bit rate.

OBJECTS AND SUMMARY OF THE INVENTION

An object of the invention is to alleviate these various drawbacks of the prior art.

To be more precise, an essential object of the invention is to provide a method of interleaving data elements of a sequence comprising N data elements, regardless of the value of N. In other words, an object of the invention is to provide a method of this kind enabling block by block interleaving of blocks (packets, frames, etc) of elements of any size.

Another object of the invention is to provide a method of this kind which can optimize the interleaving of the data elements according to the structure of the signal to be transmitted (protocol unit architectures, transmission techniques, for example).

A further object of the invention is to provide an interleaving method of this kind introducing a sufficient offset between consecutive data elements of a sequence of N data elements, and also between data elements of two consecutive sequences.

A further object of the invention is to provide a method of this kind which does not change, i.e. reduce, the bit rate of the processed signal.

One specific object of the invention is to provide a method of this kind which is simple to implement, has a short processing time, involves a small number of operations and requires a small memory capacity.

These objects, and others that emerge below, are achieved in accordance with the invention by a method of interleaving a source sequence comprising N data elements delivering an interleaved sequence corresponding to said source sequence, characterized in that it comprises at least one interleaving stage associating the data element of index j of said interleaved sequence to the data element of index i of said source sequence, the value j being determined from the value i as follows:

$$j = (a \cdot i + b) \ (\text{modulo } N) + 1$$

where:

$$1 \leq i \leq N \text{ and } 1 \leq j \leq N;$$

a is a predetermined integer relatively prime with N and such that:

$$2 \leq a \leq N-1, \text{ and}$$

b is a predetermined integer such that:

$0 < b < N-1.$

Accordingly, the length N of the source sequence can assume any value and the method of the invention is free of the constraints associated with matrix interleaving, in particular that whereby the length of the interleaved sequence must be equal to L=xy data elements.

The first and last data elements of the short sequence are moved. Accordingly, the method of the invention introduces a sufficient offset not only between the consecutive data elements of the same sequence but also between the consecutive data elements of two consecutive sequences (i.e. the last element of one and the first element of the other).

Finally, the method of the invention does not insert any stuffing elements. This avoids any reduction in the bit rate of the processed signal.

Said data elements are advantageously coded beforehand using an error correcting code capable of tolerating at most r errors in p consecutive data elements of said source sequence, and the number a is greater than or equal to the number p.

The number a corresponds to the minimal spacing (expressed as a number of data elements) between two elements of the source sequence (and therefore theoretically of the deinterleaved sequence) in corresponding relationships two consecutive data elements of the interleaved sequence.

Consequently, by making a greater than or equal to p it is certain that proper decoding at the receiving end allows correction of erroneous elements when two consecutive errors (i.e. two consecutive erroneous elements) are separated by at least p error-free data elements.

Said interleaved sequence is advantageously adapted to be transmitted over a transmission medium to a receiver, said medium being subject to fading with a maximum duration of q.T without affecting reception by said receiver, T being the time to transmit a data element and q being an integer, and the number a is chosen so that:

$E(N/a) \geq q$ where the function E( ) is the function associating with a real number its integer part.

This ensures that, in the interleaved sequence, the data elements which are erroneous because of the same fade (i.e. a maximum of q successive elements) are not adjacent in the source sequence.

The number a is preferably chosen to maximize the smaller of the two values a and E(N/a), where the function E( ) is the function associating with a real number its integer part.

This represents a compromise between the preceding two constraints, namely $a \geq p$ and $E(N/a) \geq q$.

Said method is preferably applied to the interleaving of digital signals organized in blocks of data elements each comprising N data elements.

In a preferred embodiment of the invention said method is employed in a system of transmitting data elements in frames, each frame comprising at least one packet, each packet comprising at least two wanted data element areas separated by at least one structure data element area, said interleaving stage processing only said wanted data elements.

This further improves the efficacy of interleaving as the structure element areas, i.e. the frame headers, the areas at the start, middle and end of a packet (referred to as the "preamble", "midamble" and "postamble", respectively, hereinafter) can increase the distance between data elements after interleaving.

The N data elements of a block to be interleaved come either from the same packet or from a plurality of consecutive packets (constituting a frame, for example).

Said method advantageously includes a step of determining the numbers a and b allowing for at least one of the parameters from the group comprising:

the structure of said frames;

the structure of said packets.

When the method of the invention is employed in a frequency hopping transmission using at least two transmission frequencies, said group of parameters also comprises:

the frequency in use at a given time;

the frequency hopping times.

In a preferred embodiment of the invention said method comprises the steps of:

determining a function $f_{N,a,b}$ parametered by the triplet (N, a, b) and such that $q=f_{N,a,b}(p)$, where p is the number of successive data elements of said source sequence on which there is to be no accumulation of errors so that an error correcting code can correct erroneous data elements;

q is the maximal number of successive erroneous data elements of said interleaved sequence corresponding to a fade that a transmission medium on which said interleaved sequence is transmitted can cause without affecting reception at a receiver at the output end of said transmission medium;

calculating, for each distinct value of said triplet (N, a, b), a value $p_{min}$ of the number p such that $p_{min}$ is the maximum value of p for which $f_{N,a,b}(p)$ becomes less than or equal to p;

choosing numbers a and b corresponding to the maximal value $p_{min}$.

It can be shown that regardless of the value of the triplet (N, a, b) the function $f_{N,a,b}$ is a decreasing function and has at least one point of intersection with the first bisector.

Note that N is generally imposed by the transmission system, because of the frame or packet structure, for example.

In an advantageous embodiment of the invention said data elements are bits and said method is employed in a digital mobile radio system.

Said method advantageously comprises at least two consecutive interleaving stages, A first interleaving stage associating the data element of index j of an intermediate sequence with the data element of index i of said source sequence, the value j being determined from the value i as follows:

$j = (a_1 \cdot i + b_1) \pmod{N} + 1$ and a second interleaving stage associating the data element of index j of said interleaved sequence with the data element of index i of said intermediate sequence, the value j being determined from the value i as follows:

$j = (a_2 \cdot i + b_2) \pmod{N} + 1$ where:

$a_1$ and $a_2$ are predetermined integer numbers relatively prime with N; and $b_1$ and $b_2$ are predetermined integers such that:

$$0 \leq b_1 \leq N-1 \text{ and } 0 \leq b_2 \leq N-1.$$

This represents multiple interleaving. The principle of each successive interleaving stage is similar to the principle already explained with reference to a single interleaving stage.

The invention also concerns an interleaving device comprising means for implementing an interleaving method of the invention.

BRIEF DESCRIPTION OF THE DRAWING

Other features and advantages of the invention emerge from the following description of a preferred embodiment of the invention given by way of non-limiting illustrative example only and from the appended drawings in which.

DETAILED DESCRIPTION OF THE INVENTION

The invention thus concerns an interleaving method and an interleaving device employing such a method.

Figures 1, 2:
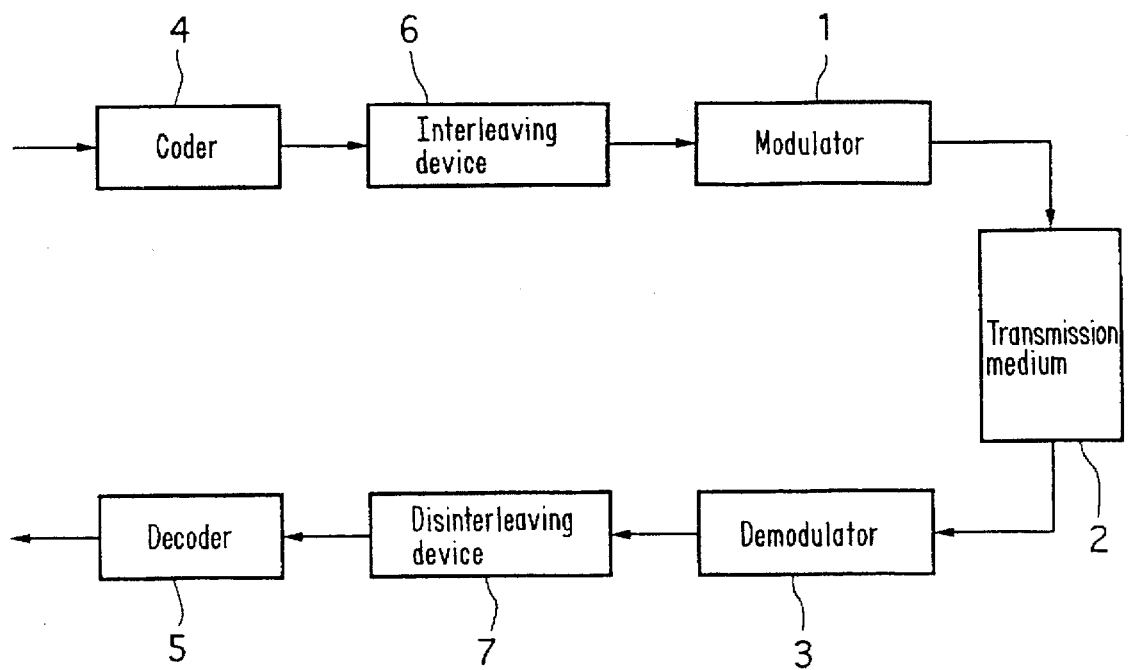
FIG. 1 is a block diagram of a transmission system used to explain the general principle of interleaving.
FIG. 2 shows a typical correspondence table relating the indexes of the elements of a source sequence and the indexes of the elements of an interleaved sequence obtained with one specific embodiment of the method of the invention.

FIG. 1 is a block diagram of a transmission system used to explain the general principle of interleaving.

The signal to be transmitted is formed by a modulator 1 before it is sent over the transmission medium 2. The transmission medium 2 degrades the signal, resulting in errors at the output of the demodulator 3. This signal degradation is partially compensated by using an error corrector code in a coder 4 on the input side of the modulator 1 (coding) and in a decoder 5 on the output side of the demodulator 3 (decoding).

Experience shows that the errors caused by the transmission medium 2 can occur in bursts or clusters. This phenomenon is called fading, with the duration of a fade expressed as a number of consecutive erroneous data elements. Fading occurs in mobile radio systems.

Error correcting codes are more effective if the errors are isolated. This is why an interleaving device 6 is provided between the coder 4 and the modulator 1 and a deinterleaving device is provided between the demodulator 3 and the decoder. The binary flux is therefore interleaved prior to transmission and deinterleaved on reception so as to split up the burst or cluster of errors and improve the efficacy of the error correcting code.

The interleaving method of the invention is of the type delivering an interleaved sequence corresponding to a source sequence comprising N data elements.

This method comprises at least one interleaving stage such that the data element of index i of the source sequence is displaced to correspond to the data element of index j of the interleaved sequence, the value j being determined from the value i as follows:

$$j = (a \cdot i + b) \text{ (modulo N)} + 1$$

where:

a is a predetermined integer relatively prime with N and such that:

$$2 \leq a \leq N-1; \text{ and}$$

b is a predetermined integer such that:

$$0 \leq b \leq N-1.$$

FIG. 2 shows a typical table of correspondence between the indexes of the elements of a source sequence and the indexes of the elements of an interleaved sequence of data elements. In this specific implementation N=17, a=4 and b=0.

For example, the data element in 14th place in the source sequence (index 14) occupies the sixth place in the interleaved sequence (index 6). This is because:

$$(4 \times 14 + 0) \text{ (modulo 17)} + 1 = 5 + 1 = 6.$$

Hereinafter it is assumed that the error correcting code used is of the type tolerating at most one error in p consecutive data elements of the source sequence. In other words, p is the number of consecutive data elements over which there is to be no accumulation of errors.

In this case the method of the invention is such that the number a is chosen so that: $a \geq p$.

The remainder of the description also assumes that the transmission medium is subject to fades with a maximum duration of $q \cdot T$ where T is the time to transmit a data element and q is an integer. In other words, q is the length (number of data elements) of the error packet to be split up.

In this case, the method of the invention is such that the number a is chosen so that: $E(N/a) \geq q$, where E is the function associating with a real number its integer part.

One compromise between the two constraints on a, that is $a \geq p$ and $E(N/a) \geq q$, is to choose the number a in such a way as to maximize the smaller of the two values a and $E(N/a)$. In other words, determining the number a which maximizes the function:

$$\text{Max}_a, (\text{Min}(a, E(N/a)).$$

If these two constraints are complied with, the resulting interleaving is suitable for the error correcting code and for the transmission medium. In other words, two data elements chosen from q consecutive elements after interleaving at least p data elements apart before interleaving.

The parameter b can be regarded as similar to a phase. The value of b is chosen to obtain the most effective interleaving. This choice can take account of many parameters, including the structure of the block to be interleaved.

Note that to further improve interleaving the method of the invention can comprise at least two successive interleaving stages of the type previously described. Where there are two successive stages the elements of the source sequence are first interleaved to constitute an intermediate sequence after which the elements of the intermediate sequence are interleaved to constitute the interleaved sequence transmitted over the transmission medium.

If i, j and k represent the index of the same data element in the source sequence, the intermediate sequence and the interleaved sequence, respectively, then:

$$j=(a_1 \cdot i + b_1) \text{ (modulo N)} +1$$

$$k=(a_2 \cdot i + b_2) \text{ (modulo n)} +1$$

where:

$a_1$ and $a_2$ are predetermined integers relatively prime with N; and $b_1$ and $b_2$ are predetermined integers such that:

$$0 \leq b_1 \leq N-1 \text{ and } 0 \leq b_2 \leq N-1.$$

The various coefficients ($a_1$, $a_2$, $b_1$, $b_2$) are chosen so that the overall interleaving produced by the succession of the two interleaving stages is such that two data elements chosen from q consecutive elements after interleaving are at least p data elements apart before interleaving.

The number N of data elements of the source sequence to be interleaved can take any predetermined value with the result that the method of the invention is entirely suitable for interleaving digital signals organized into blocks of data elements each comprising N data elements.

A specific embodiment of the method of the invention is described hereinafter with reference to a digital mobile radio system, in which the data elements are bits. It is nevertheless clear that the method of the invention is not limited to any such application and that it can be readily adapted to many other situations without departing from the scope of the invention.

In a digital mobile radio system the data elements (or bits, to be more precise) are transmitted in frames.

Figure 3:
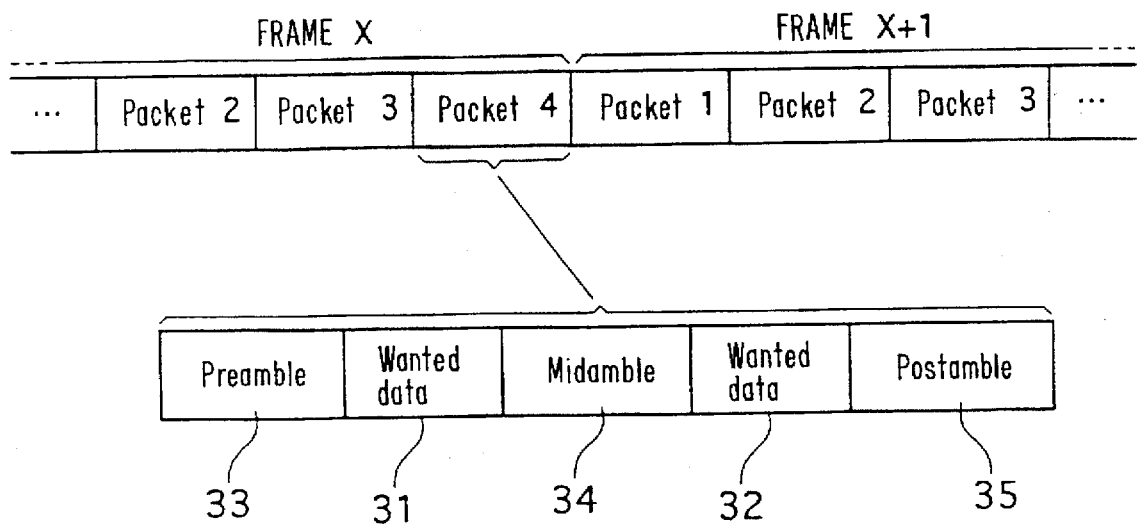
FIG. 3 shows a typical structure of a stream of data elements transmitted in a system as shown in FIG. 1, this structure being particularly suited to an advantageous implementation of the method of the invention.

FIG. 3 shows a typical structure of a stream of bits to be transmitted. The stream is made up of a succession of frames (..., FRAME X, FRAME (X+1), ...). Each frame is itself made up of a succession of packets, four packets in this example (PACKET 1 to PACKET 4). In the case of a time-division multiple access (TDMA) system the packets dedicated to a given call repeat at a particular frequency. The example concerns the TDMA4 system, in which four calls are time-division multiplexed and the packets of the same call repeat every four packets.

Finally, each packet contains five areas:

firstly, three structure data element areas, at the start, middle and end of the packet and hereinafter respectively called the "preamble", "midamble" and "postamble"; and secondly, two wanted data element areas.

The wanted data element areas 31, 32 convey the information proper whereas the structure data element areas 33 to 35 are required for the system to operate but restrict the throughput of wanted information transmitted by the system.

Interleaving affects only the information bits (i.e. the wanted data elements of areas 31, 32).

A block of N data elements constituting a source sequence can therefore be in corresponding relationship to the bits of one packet or of more than one packet. This use of the frame and packet structure can enhance the efficacy of the interleaving. The structure data element areas increase the distance between the information bits after interleaving. This amounts to increasing the possible value of q for a given value of p.

A stage for determining the numbers a and b usually precedes the interleaving stage. In the case of a packet transmission system, the determination stage thus consists in choosing the numbers a and b allowing for the frame structure and/or the packet structure.

Also, if the method is employed in a frequency hopping transmission system using at least two transmission frequencies, the frequency in use at a given time and/or the frequency hopping times can also be taken into account in the stage in which the numbers a and b are determined.

In the following example, which is purely illustrative, interleaving is restricted to interleaving within a single packet. In this case the midamble is used to enhance the interleaving of the wanted data elements of the two corresponding areas contained in the packet.

In this example the first and second wanted data element areas 31 and 32 respectively contain $n_1$ and $n_2$ elements, where $n_1 + n_2 = N$.

The source sequence therefore comprises the concatenation of:

$n_1$ elements of index i between 1 and $n_1$; and $n_2$ elements of index i between ($n_1+1$) and N.

As previously described, the interleaving stage entails moving the ith wanted data element of the source sequence into the jth place of the interleaved sequence, with j defined as follows:

$$j=(a \cdot i + b) \text{ (modulo N)} +1$$

where:

a is a predetermined integer relatively prime with N and such that:

$$2 \leq a \leq N-1; \text{ and}$$

b is a predetermined integer such that:

$$0 \leq b \leq N-1.$$

The numbers a and b are determined as follows, for example:

a function $f_{N,a,b}$ parametered by the triplet (N, a, b) is determined such that: $q=f_{N,a,b}(p)$;

for each separate value of the triplet (N, a, b), a value $p_{min}$ of the number p is calculated such that $p_{min}$ is the maximal value of p for which $f_{N,a,b}(p)$ becomes less than or equal to p;

the numbers a and b corresponding to the maximal $p_{min}$ are chosen.

It can be shown that this function $f_{N,a,b}$ is a decreasing function and such that:

for any triplet (N, a, b): $f_{N,a,b}(N)=1$;

$f_{N,a,b}(1) \geq 1$.

Consequently, there is always a value $p_{min}$ regardless of the value of the triplet (N, a, b).

One example of the use of a method like this for optimizing the choice of the numbers a and b is described with reference to FIG. 4. In this example N=432 and b=0 and the number a is to be determined.

Figure 4:
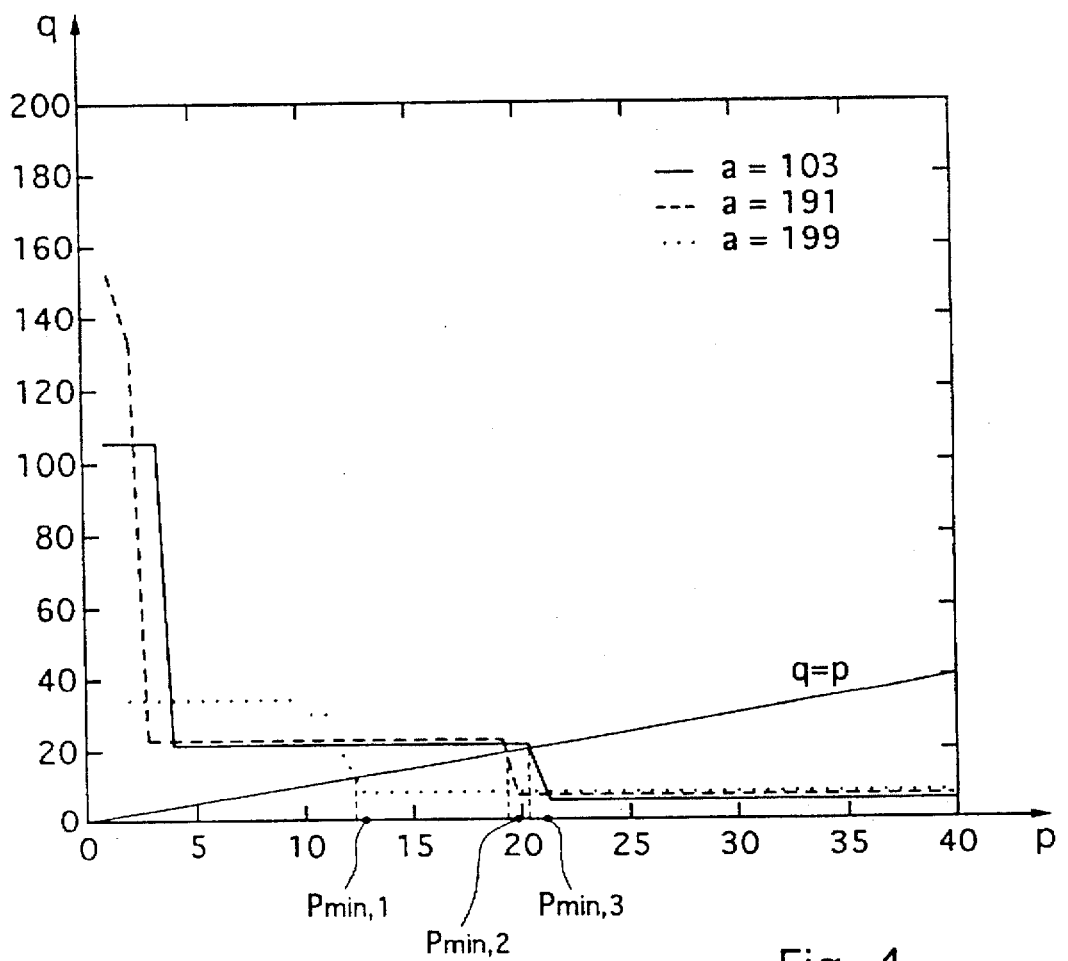
FIG. 4 shows three examples of the variation of the number $q=f_{N,a,b}(p)$ as a function of the number p, each example corresponding to a different value of the triplet (N, a, b).

For simplicity, FIG. 4 shows only three examples of variation of the number $q=f_{N,a,b}(p)$ as a function of the number p, each example corresponding to a separate value of the triplet (N, a, b). Consequently, N and b being fixed, each example corresponds to a separate value of a.

Thus:

for a=199, $p_{min,1}$=13;

for a=151, $p_{min,2}$=20;

for a=103, $p_{min,3}$=21.

Consequently, the value a=103 corresponding to the maximal $p_{min}$ ($p_{min,3}$=21) is chosen.

It is clear that many other embodiments of the stage for determining the numbers a and b are feasible.

As a general rule, simulations and tests can be used for a set of different values of the numbers a and b, using a digital computation device, for example, the values retained being those found to be the most effective from the decoding point of view.

Nevertheless, it is necessary to verify that the numbers chosen result in interleaving that is suited to the transmitted medium.

The invention naturally further concerns any interleaving device using an interleaving method of the invention, regardless of how the method is implemented.

We claim:

1. A method of interleaving a source sequence comprising N data elements delivering an interleaved sequence corresponding to said source sequence, said method comprising at least one interleaving step associating the data element of index j of said interleaved sequence to the data element of index i of said source sequence, the value j being determined from the value i as follows:

$$j = (a \cdot i + b) \text{ (modulo N)} + 1$$

where:

$$1 \leq i \leq N \text{ and } 1 \leq j \leq N;$$

a is a predetermined integer relatively prime with N and such that:

$$2 \leq a \leq N-1, \text{ and}$$

b is a predetermined integer such that:

$$0 \leq b \leq N-1.$$

2. The method according to claim 1, wherein said data elements are previously coded using an error correcting code tolerating at most r errors in p consecutive data elements in said source sequence, where r and p are integers and $a \geq p$.

3. The method according to claim 1, wherein said interleaved sequence is adapted to be transmitted over a transmission medium (2) to a receiver, said medium being subject to fading with a maximum fade duration of q·T without affecting reception at said receiver, T being the time to transmit a data element and q being an integer, and the number a is chosen so that:

$$E(N/a) \geq q$$

wherein the function E(N/a) represents the integer part of N/a.

4. The method according to claim 1, wherein the number a is chosen to maximize the smaller of the two values a and E(N/a), wherein the function E(N/a) represents the integer part of N/a.

5. The method according to claim 1, wherein said source sequence comprises digital signals organized into blocks of data elements each comprising N data elements.

6. The method according to claim 1, of the type employed in a system for transmitting data elements in frames (FRAME X, FRAME (X+1)), each of said frames comprising at least one packet (PACKET 1 to PACKET 4), each of said packets comprising at least two wanted data element areas (31, 32) separated by at least one structure data element area (33 to 35), wherein said interleaving step is applied only to said wanted data elements.

7. The method according to claim 1, further comprising a determining step of determining the numbers a and b in accordance with at least one parameter from a group of parameters comprising (a) the structure of said frames and (b) the structure of said packets.

8. The method according to claim 7 of the type employed in a frequency hopping transmission system using at least two transmission frequencies, wherein said group of parameters further includes (c) the frequency in use at a given time, and (d) the frequency hopping times.

9. The method according to claim 1, further comprising the steps of:

determining a function $f_{N,a,b}(p)$, where:

p is the number of successive data elements of said source sequence in which there is to be no accumulation of errors so that an error correcting code can correct erroneous data elements;

q is the maximal number of successive erroneous data elements of said interleaved sequence corresponding to a fade that a transmission medium on which said interleaved sequence is transmitted can cause without affecting reception at a receiver at the output end of said transmission medium;

calculating, for each separate value of said triplet (N, a, b), a value $p_{min}$ of the number p such that $p_{min}$ is the maximal value of p for which $f_{N,a,b}(p)$ becomes less than or equal to p; and choosing numbers a and b corresponding to the maximal value $p_{min}$.

10. The method according to claim 1, wherein said data elements are bits.

11. The method according to claim 1, further comprising at least two consecutive interleaving steps, a first interleaving step associating the data element of index j of an intermediate sequence with the data element of index i of said source sequence, the value j being determined from the value i as follows:

$$j = (a_1 \cdot i + b_1) \text{ (modulo N)} + 1$$

and a second interleaving step associating the data element of index j of said interleaved sequence with the data element of index i of said intermediate sequence, the value j being determined from the value i as follows:

$$j = (a_2 \cdot i + b_2) \text{ (modulo N)} + 1$$

where:

$a_1$ and $a_2$ are predetermined integers relatively prime with N; and $b_1$ and $b_2$ are predetermined integers such that $$0 \leq b_1 \leq N-1 \text{ and } 0 \leq b_2 \leq N-1.$$

12. The method according to claim 1, wherein said N data elements are digital signals in a digital mobile radio system.

13. An interleaving device for interleaving a source sequence comprising N data elements to deliver an interleaved sequence corresponding to said source sequence, said device comprising determining means for determining values of a and b, where a and b are integers, and interleaving means for associating a data element of index j of said interleaved sequence to a data element of index i of said source sequence, the value j being determined from the value i as follows:

$$j = (a \cdot i + b) \text{ (modulo n)} + 1$$

where:

$$1 \leq i \leq N \text{ and } 1 \leq j \leq N;$$

a is a predetermined integer relatively prime with N and such that $2 \leq a \leq N-1$; and b is a predetermined integer such that $0 \leq b \leq N-1$.

* * * * *